(12) United States Patent
Zhou

(10) Patent No.: US 10,388,575 B2
(45) Date of Patent: Aug. 20, 2019

(54) SEMICONDUCTOR DEVICES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shaghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 15/985,278

(22) Filed: May 21, 2018

(65) Prior Publication Data

US 2018/0337099 A1    Nov. 22, 2018

(30) Foreign Application Priority Data

May 22, 2017 (CN) .......................... 2017 1 0364138

(51) Int. Cl.
  *H01L 21/28* (2006.01)
  *H01L 27/02* (2006.01)
  (Continued)

(52) U.S. Cl.
  CPC ............... *H01L 21/823842* (2013.01); *H01L 21/28088* (2013.01); *H01L 21/28556* (2013.01); *H01L 21/32135* (2013.01); *H01L 21/32139* (2013.01); *H01L 21/823821* (2013.01); *H01L 27/0207* (2013.01); *H01L 27/092* (2013.01); *H01L 27/0924* (2013.01); *H01L 29/42372* (2013.01); *H01L 29/4966* (2013.01); *H01L 29/785* (2013.01)

(58) Field of Classification Search
  CPC ........... H01L 21/823842; H01L 27/092; H01L 29/785; H01L 27/0924; H01L 29/4966; H01L 21/823821; H01L 27/0207
  USPC .......................... 438/169; 257/330, 351, 371
  See application file for complete search history.

(56) References Cited

U.S. PATENT DOCUMENTS

2004/0207023 A1* 10/2004 Nishiyama ........ H01L 21/28185
                                                     257/371
2005/0139926 A1*  6/2005 Shimizu ............ H01L 21/28194
                                                     257/351

(Continued)

*Primary Examiner* — Bo Fan
(74) *Attorney, Agent, or Firm* — Anova Law Group, PLLC

(57) ABSTRACT

A method for fabricating a semiconductor structure includes providing a base substrate including a first device region, a second device region, and a transition region separating the first region from the second region; forming a first work function layer on the first region, the transition region, and the second region; removing a first portion of the first work function layer formed in the transition region; forming a hard mask layer on the base substrate in the transition region and on the first work function layer in the second region; removing a second portion the first work function layer formed in the first region using the hard mask layer as an etch mask; removing the hard mask layer; and forming a second work function layer, on the base substrate in the first region and the transition region, and on the first work function layer in the second region.

16 Claims, 8 Drawing Sheets

(51) Int. Cl.
*H01L 29/49* (2006.01)
*H01L 29/78* (2006.01)
*H01L 21/285* (2006.01)
*H01L 27/092* (2006.01)
*H01L 29/423* (2006.01)
*H01L 21/3213* (2006.01)
*H01L 21/8238* (2006.01)

(56) References Cited

U.S. PATENT DOCUMENTS

2014/0177312 A1* 6/2014 Shibata ............... H01L 27/0207
  365/72
2016/0133742 A1* 5/2016 Okuda ................ H01L 29/7813
  257/330

* cited by examiner

US 10,388,575 B2

SEMICONDUCTOR DEVICES AND FABRICATION METHODS THEREOF

CROSS-REFERENCES TO RELATED APPLICATIONS

This application claims the priority of Chinese Patent Application No. CN201710364138.3, filed on May 22, 2017, the entire content of which is incorporated herein by reference.

FIELD OF THE DISCLOSURE

The present disclosure generally relates to the field of semiconductor fabrication technology and, more particularly, relates to semiconductor devices and fabrication methods thereof.

BACKGROUND

With the rapid development of semiconductor technology, the feature size of semiconductor structures is continuously reduced, and the integration level of integrated circuits (ICs) is steadily improved. Accordingly, the requirements on device performance are also becoming higher and higher.

Currently, with the dimension of metal-oxide-semiconductor field-effect transistor (MOSFET) continuously becoming smaller, in order to accommodate the reduction of the process node, the channel length in MOSFET devices may have to be reduced, which may be conducive to increasing the density of the chip, improving the switching speed of the MOSFET devices, etc.

However, as the channel length of devices decreases, the distance between the source region and the drain region may also be reduced. Therefore, the ability of the gate structure in controlling the channel may be degraded such that pinching off the channel by the gate may be more and more difficult. As such, the sub-threshold leakage phenomenon, i.e. the short-channel effect (SCE), becomes a crucial technical challenge and needs to be resolved.

In order to accommodate the requirements for scaling-down semiconductor devices, semiconductor process gradually switches from planar MOSFET devices to more efficient three-dimensional (3D) transistor devices, such as fin field-effect transistors (Fin-FETs). Fin-FET devices demonstrate desired ability in control the channels.

However, the electrical performance of the conventional semiconductor structures may still need to be improved. The disclosed semiconductor devices and fabrication methods thereof are directed to solve one or more problems set forth above and other problems in the art.

BRIEF SUMMARY OF THE DISCLOSURE

One aspect of the present disclosure provides a method for fabricating a semiconductor device. The method includes providing a base substrate including a first device region, a second device region, and a transition region separating the first region from the second region; forming a first work function layer on the first region, the transition region, and the second region of the base substrate; removing a first portion of the first work function layer formed in the transition region; forming a hard mask layer on the base substrate in the transition region and on the first work function layer in the second region; removing a second portion the first work function layer formed in the first region using the hard mask layer as an etch mask; removing the hard mask layer; and forming a second work function layer, on the base substrate in the first region and the transition region, and on the first work function layer in the second region.

Another aspect of the present disclosure provides a semiconductor device. The semiconductor structure includes a base substrate including a first device region, a second device region, and a transition region separating the first region from the second region; a first work function layer formed on the base substrate in the second region; and a second work function layer formed on the base substrate in the first region and the transition region, and on the first work function layer in the second region.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

FIGS. 1-5 illustrate schematic views of semiconductor structures at certain stages of a method for fabricating a semiconductor structure.

Figure 1:
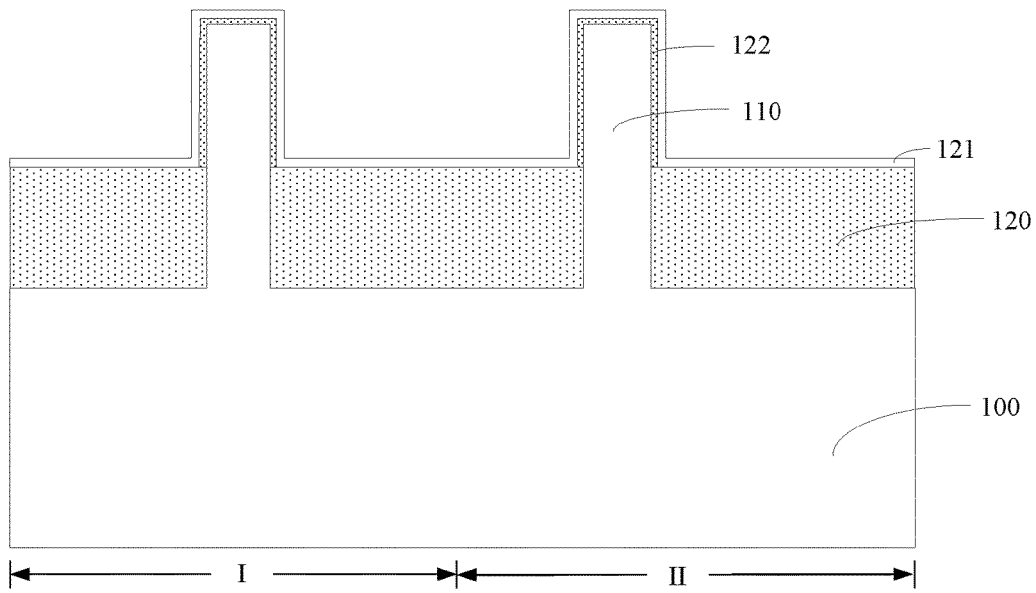
FIGS. 1-5 illustrate schematic views of semiconductor structures at certain stages of a method for fabricating a semiconductor structure.

Referring to FIG. 1, a substrate 100 is provided. A plurality of discrete fin structures 110 are formed on the substrate 100. The substrate 100 includes a first region I used to form a plurality of first devices, and a second region II used to form a plurality of second devices. An isolation layer 120 is formed on the portion of the substrate 100 exposed by the plurality of fin structures 110. An interfacial dielectric layer 122 may be formed to cover the portion of each fin structure 110 formed above the isolation layer 120. Moreover, a high-k dielectric layer 121 is formed on the interfacial dielectric layer 122 and the portion of the isolation layer 120 exposed by the plurality of fin structures 110.

Figure 2:
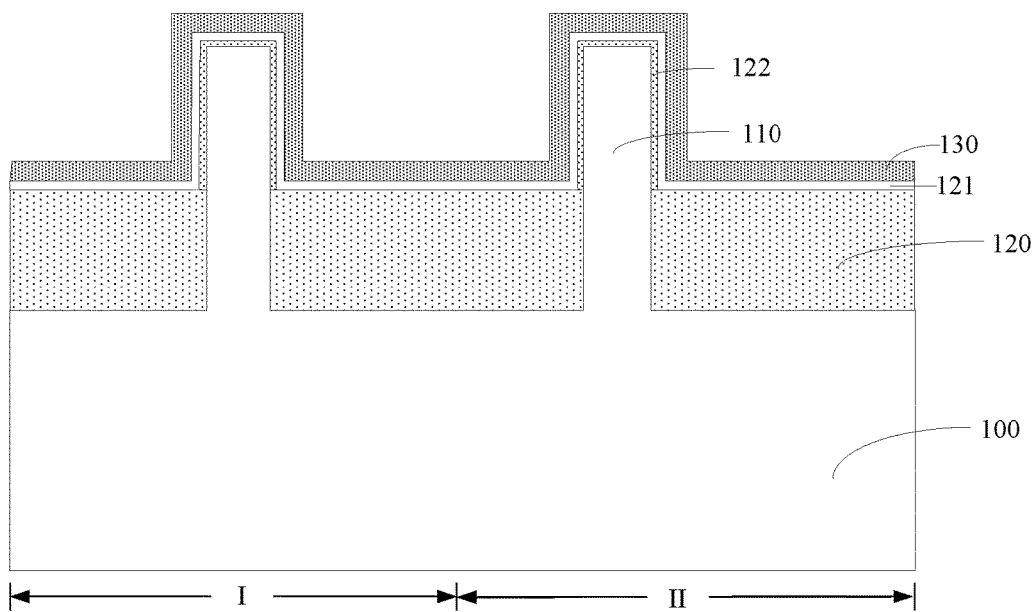

Referring to FIG. 2, a first work function layer 130 is formed on the high-k dielectric layer 121.

Figure 3:
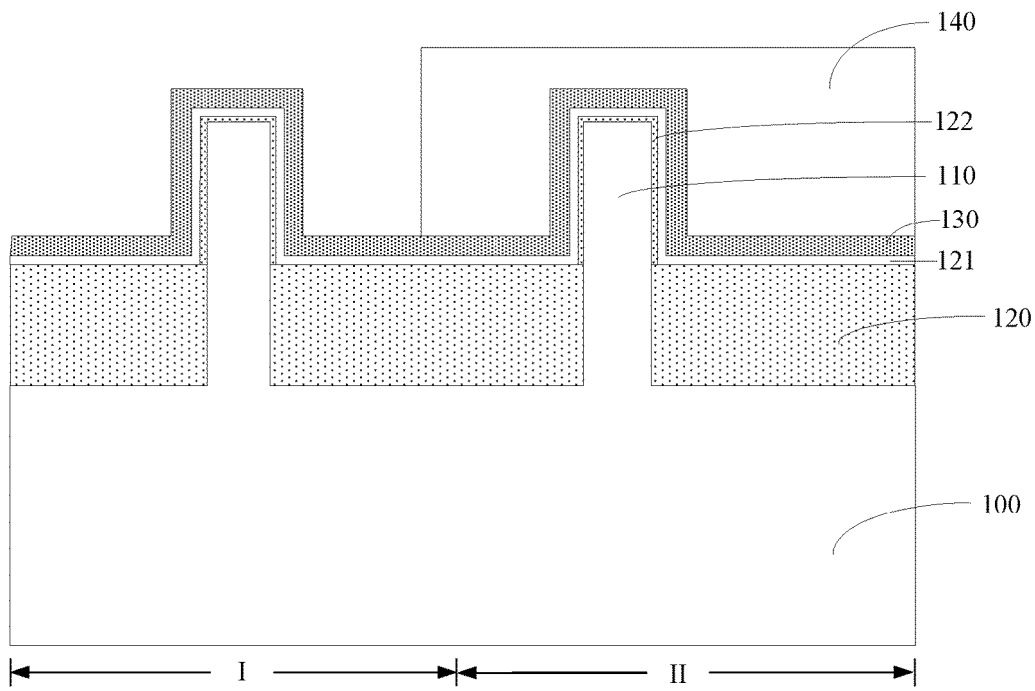

Referring to FIG. 3, a hard mask layer 140 is formed in the second region II to cover the plurality of fin structures 110 and the isolation layer 120.

Figure 4:
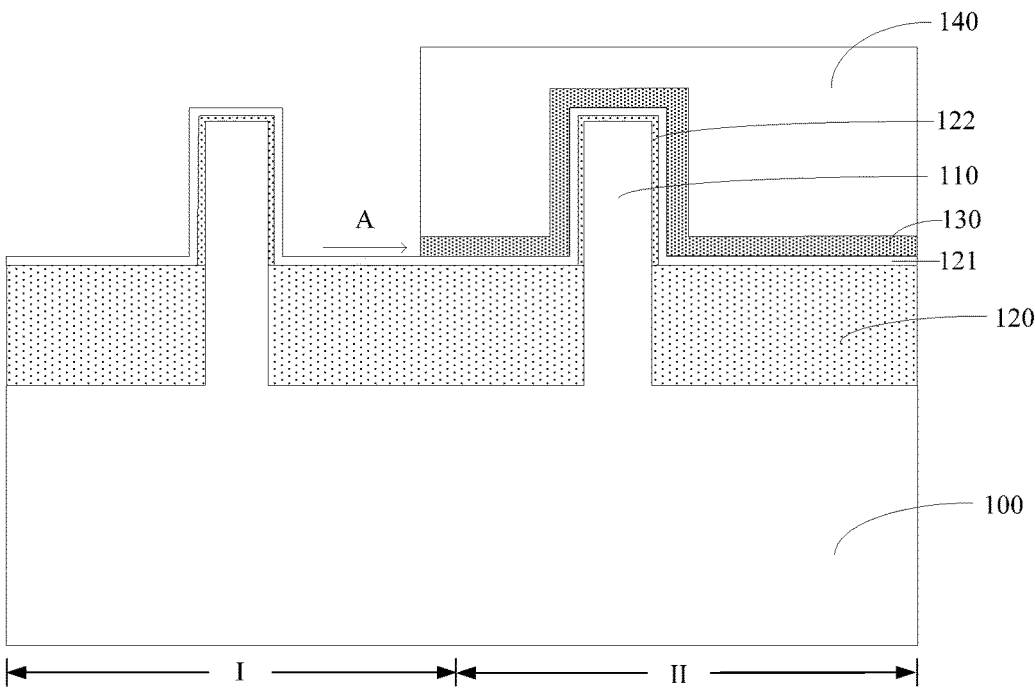

Referring to FIG. 4, the portion of the first work function layer 130 formed in the first region I is removed by etching using the hard mask layer 140 as an etch mask.

Figure 5:
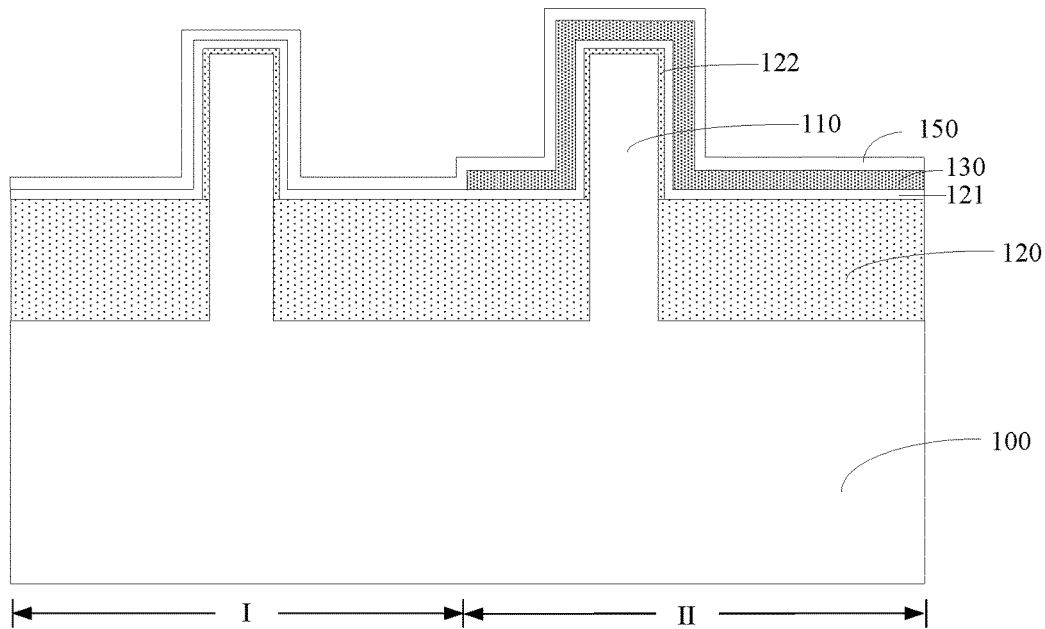

Referring to FIG. 5, the hard mask layer 140 is removed, and a second work function layer 150 is formed on the high-k dielectric layer 121 in the first region and also on the first work function layer 130 in the second region II.

The electrical performance of the formed semiconductor structure may not be desired due to several reasons. According to the fabrication process described above, after forming the hard mask layer 140 in the second region II on the fin structures 110 and the isolation layer 120, the portion of the first work function layer 130 formed in the first region I is then removed by etching using the hard mask layer 140 as the etch mask. Usually, a wet etching process is performed to remove the portion of the first work function layer 130 formed in the first region I. Although the hard mask layer is formed on the first work function layer 130 in the second region II, i.e., the first work function layer 130 in the second region II is located between the hard mask layer 140 and the high-k dielectric layer 121, the side surface of the first work function layer 130 (indicated by an arrow 'A' in FIG. 4) may still be exposed to the etch solution during the wet etching process. Therefore, the etch solution may also be able to etch the portion of the first work function layer 130 formed in the second region II. As such, the quality of the first work function layer 130 in the second region II may be undesirably degraded. In addition, the etching effect of the etch solution may also lead to more surface lattice defects in the portion of the high-k dielectric layer 121 formed between the first region I and the second region II. As such, the quality of the subsequently-formed second work function layer 150 in the first region I may be undesirably degraded, and the electrical performance of the semiconductor structure may need to be improved.

Figure 12:
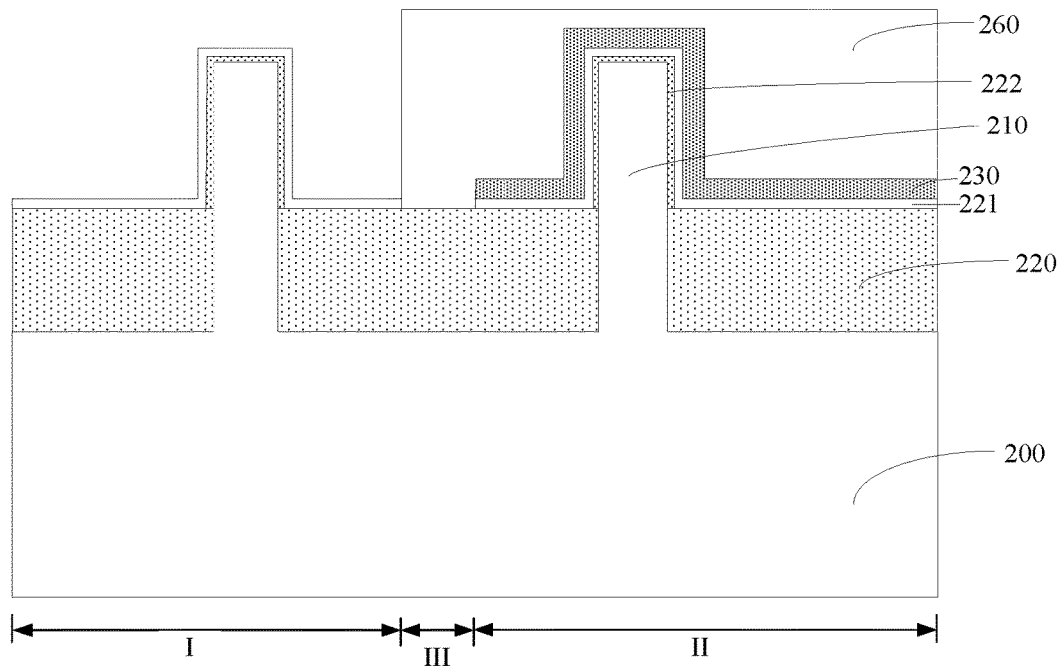
Figure 13:
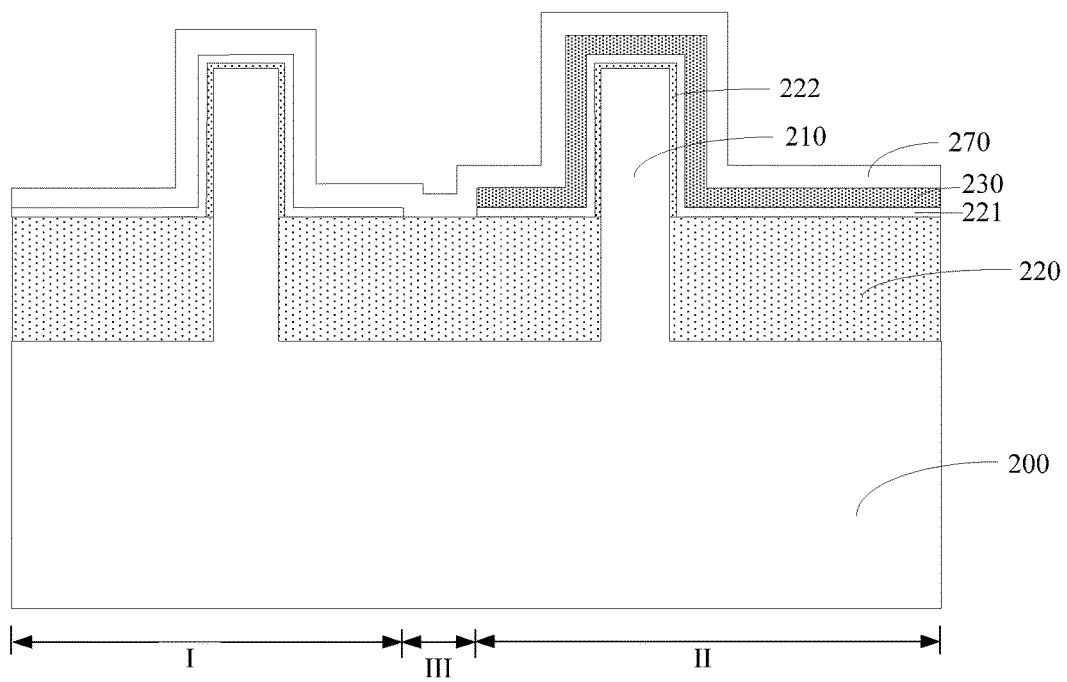
Figure 14:
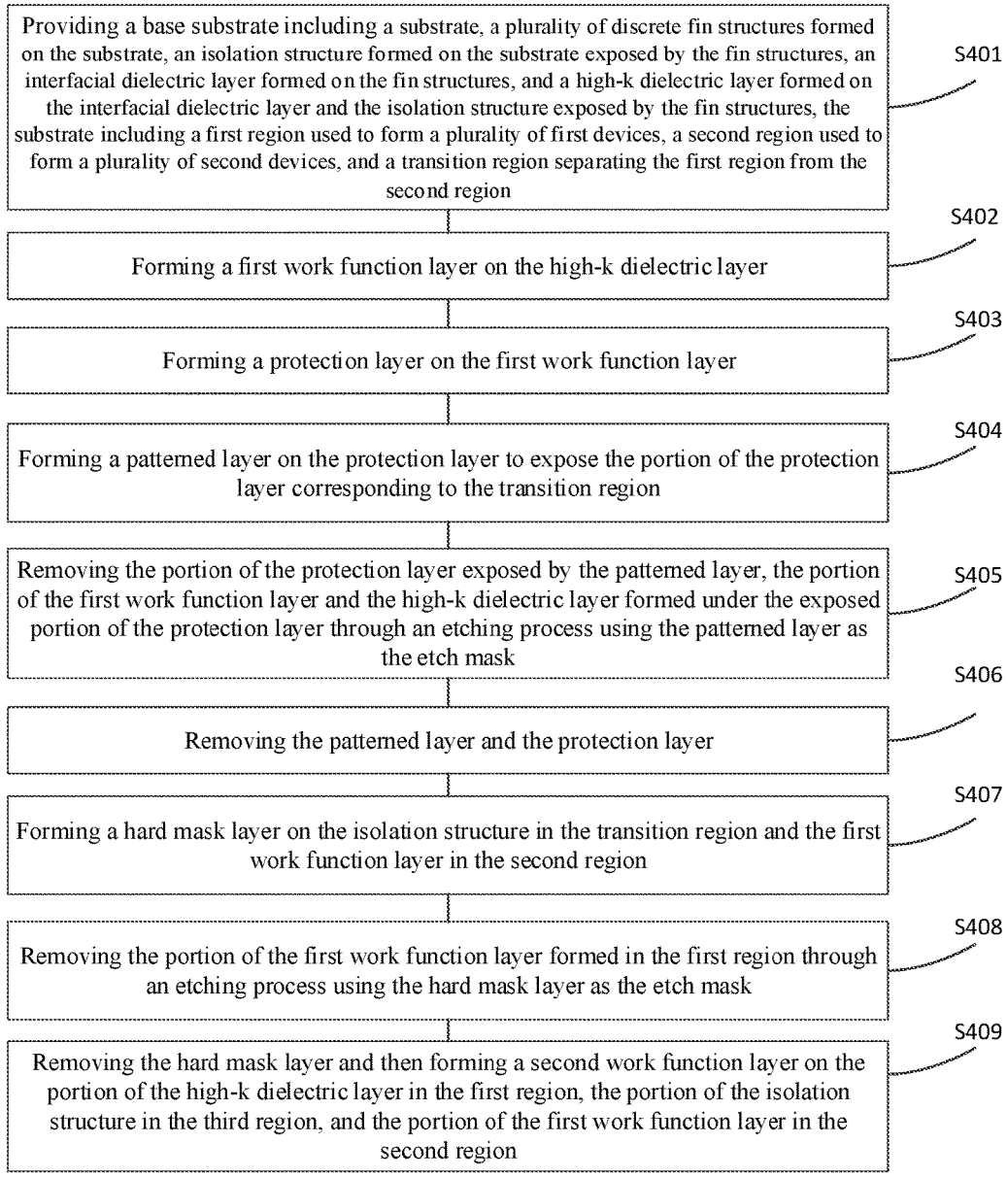
FIG. 14 illustrates a flowchart of the exemplary method for fabricating the semiconductor structure consistent with various embodiments of the present disclosure.

The present disclosure provides semiconductor structures with improved electrical performance and their fabricating methods. FIG. 14 illustrates a flowchart of the exemplary method for fabricating the semiconductor structure consistent with various embodiments of the present disclosure. FIGS. 6-13 illustrate schematic views of semiconductor structures at certain stages of the exemplary fabrication method.

Figure 6:
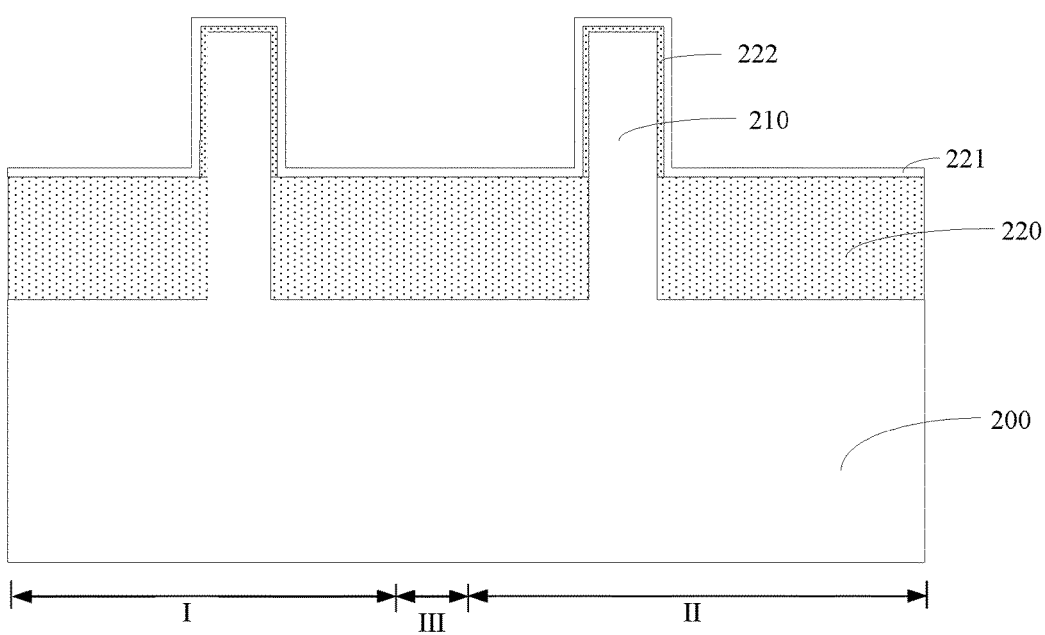
FIGS. 6-13 illustrate schematic views of semiconductor structures at certain stages of an exemplary fabrication method for a semiconductor structure consistent with various embodiments of the present disclosure.

Referring to FIG. 14, a base substrate may be provided, the base substrate including a substrate, a plurality of discrete fin structures formed on the substrate, an isolation structure formed on the substrate exposed by the fin structures, an interfacial dielectric layer formed on the fin structures, and a high-k dielectric layer formed on the interfacial dielectric layer and the isolation structure exposed by the fin structures, and the substrate including a first region used to form a plurality of first devices, a second region used to form a plurality of second devices, and a transition region separating the first region from the second region (S401). FIG. 6 illustrates a schematic cross-section view of a semiconductor structure consistent with various embodiments of the present disclosure.

Referring to FIG. 6, a base substrate may be provided. The base substrate may include a substrate 200 and a plurality of discrete fin structures 210 formed on the substrate 200. The substrate 200 may include a first region I used to form a plurality of first devices, a second region II used to form a plurality of second devices, and a transition region III separating the first region I from the second region II. In one embodiment, the dimension of the transition region III may be defined in a subsequent process.

The base substrate may also include an isolation structure 220 formed on the substrate 200 exposed by the fin structures 210, an interfacial dielectric layer 222 formed on the plurality of fin structures 220, and a high-k dielectric layer 221 formed on the interfacial layer 222 and also on the portion of the isolation structure 220 exposed by the fin structures 210.

In one embodiment, the semiconductor structure to be formed is a fin field-effect transistor (Fin-FET) device. In other embodiments, the semiconductor structure to be formed may have a planar structure, and accordingly, the base substrate may be a planar substrate.

The type of the plurality of first devices formed in the first region I may be different from the type of the plurality of second devices formed in the second region II. In one embodiment, the plurality of first devices are N-type metal-oxide-semiconductor (NMOS) devices and the plurality of second devices are P-type metal-oxide-semiconductor (PMOS) devices. In other embodiments, the plurality of first devices may be PMOS devices and the plurality of second devices may be NMOS devices.

In one embodiment, the substrate 200 may be made of Si. In other embodiments, the substrate may be made of Ge, SiGe, SiC, GaAs, InAs, or any other appropriate semiconductor material. Alternatively, the substrate may be made of Si on insulator (SOI), Ge on insulator (GOI), or any other appropriate composite structure.

In one embodiment, the plurality of fin structures 210 may be made of Si. In other embodiments, the plurality of fin structures may be made of Ge, SiGe, SiC, GaAs, InAs, or any other appropriate semiconductor material.

In one embodiment, the isolation structure 220 may be used to electrically isolate neighboring fin structures 210. The isolation structure 220 may be made of $SiO_2$. In other embodiments, the isolation structure may be made of SiN, SiON, or any other appropriate material.

In one embodiment, the interfacial dielectric layer 222 may be made of at least one of $SiO_2$ and SiON. The interfacial dielectric layer 222 may be formed by an oxidation process.

In one embodiment, the high-k dielectric layer 221 may be made of a high-k dielectric material. For example, the high-k dielectric material may include one or more of $HfO_2$, $TaO_2$, HfLaO, etc.

Figure 7:
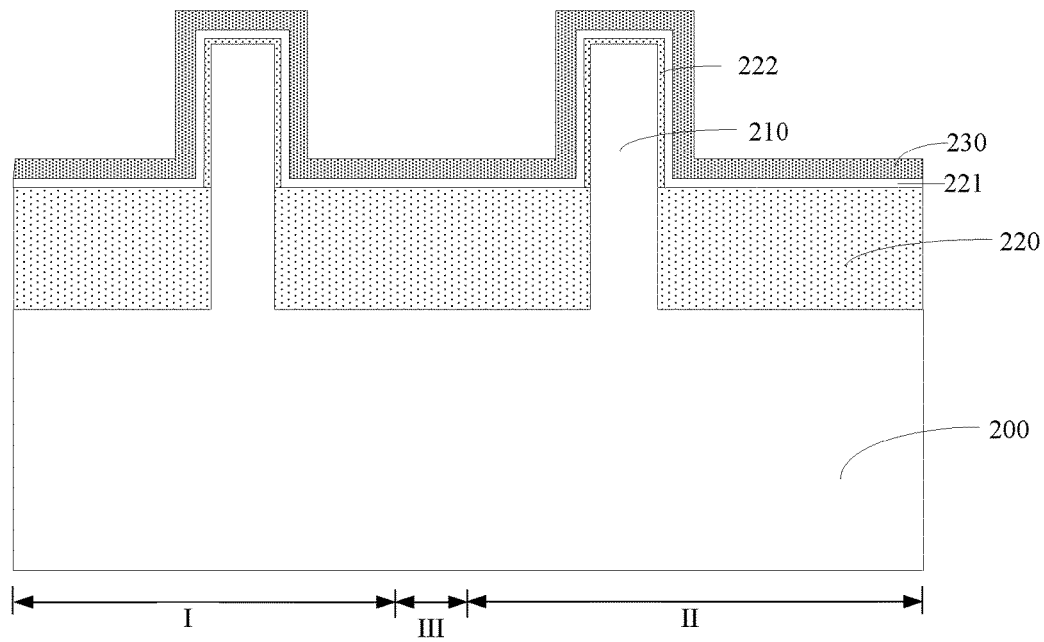

Referring back to FIG. 14, a first work function layer may be formed on the high-k dielectric layer (S402). FIG. 7 illustrates a schematic cross-section view of a semiconductor structure consistent with some embodiments of the present disclosure.

Referring to FIG. 7, a first work function layer 230 may be formed on the high-k dielectric layer 221. In one embodiment, the first work function layer 230 may be used to adjust the threshold voltages of subsequently-formed second devices. The first work function layer 230 may be made of one or more of TiN, TaN, TiSiN, and any other appropriate material.

In one embodiment, the thickness of the first work function layer 230 may be determined according to the requirements of the second devices. The thickness of the first work function layer 230 may not be too large or too small. When the thickness of the first work function layer 230 is too large or too small, the first work function layer 230 may not electrically match with the second devices. Therefore, in one embodiment, the thickness of the first work function layer 230 may be in a range of approximately 25 Å to 50 Å.

In one embodiment, the first work function layer 230 may be formed by an atomic layer deposition (ALD) process or a chemical vapor deposition (CVD) process.

Figure 8:
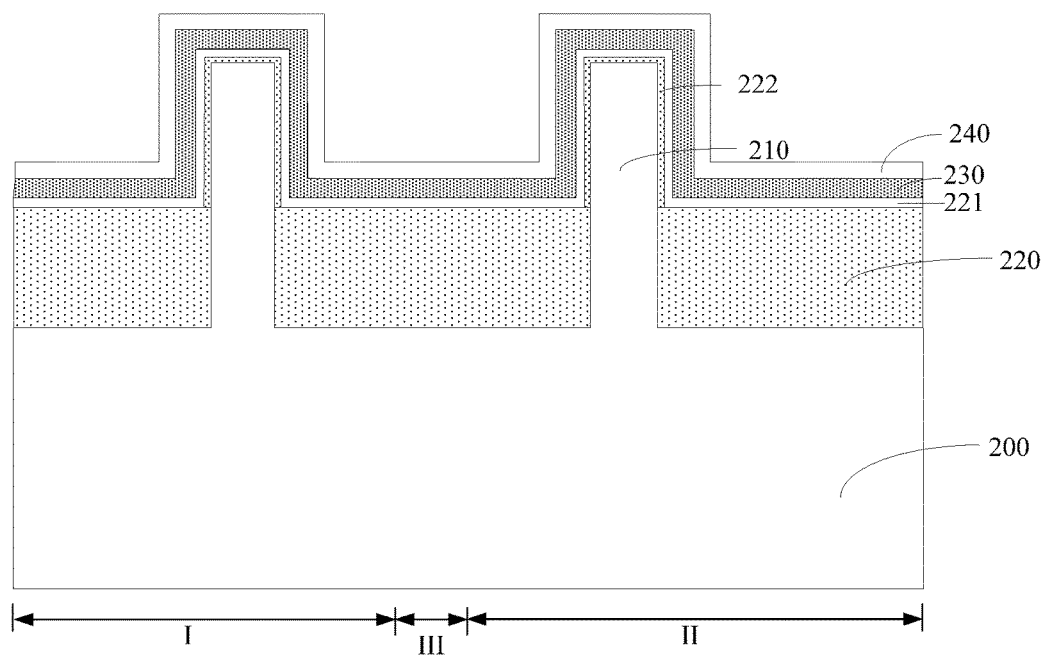

Referring back to FIG. 14, a protection layer may be formed on the first work function layer (S403). FIG. 8 illustrates a schematic cross-section view of a semiconductor structure consistent with some embodiments of the present disclosure.

Referring to FIG. 8, a protection layer 240 may be formed on the first work function layer 230. In one embodiment, the protection layer may be used to isolate the first work function layer 230 from a subsequently-formed patterned layer. The protection layer 240 may be made of at least one of polycrystalline Si and amorphous Si.

Figure 9:
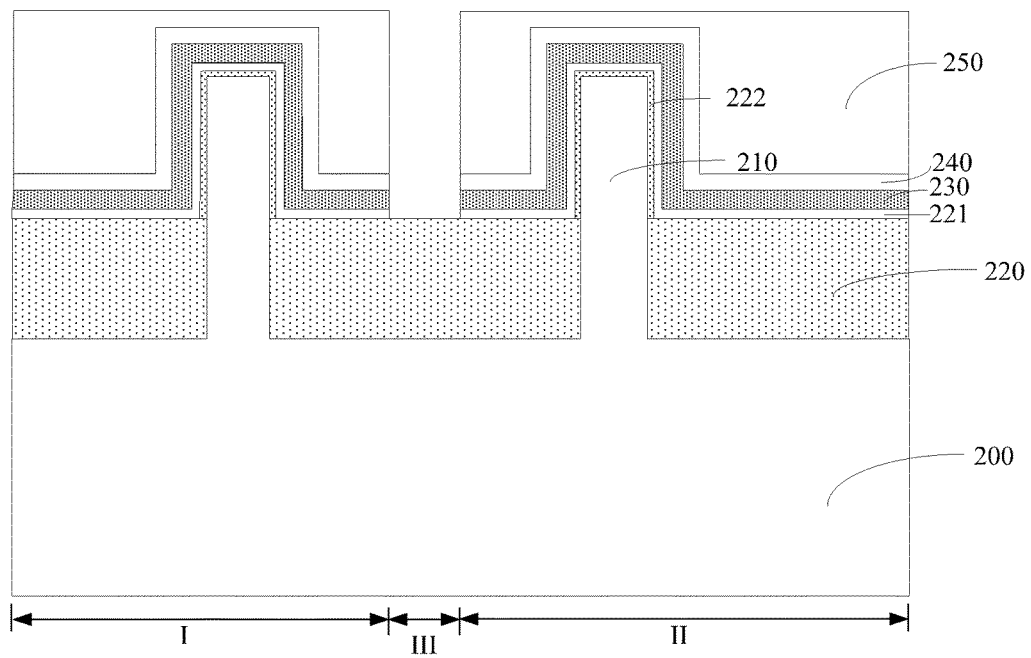

Further, returning to FIG. 14, a patterned layer may be formed on the protection layer, and the portion of the protection layer corresponding to the transition region may be exposed by the patterned layer (S404). FIG. 9 illustrates a schematic cross-section view of a semiconductor structure consistent with some embodiments of the present disclosure.

Referring to FIG. 9, a patterned layer 250 may be formed on the protection layer 240. The patterned layer 250 may expose a portion of the protection layer 240. Moreover, the exposed portion of the protection layer 240 may correspond to the transition region III.

In one embodiment, the patterned layer 250 may be used as an etch mask during a subsequently-performed etching process to remove the portion of each of the protection layer 240, the first work function layer 230, and the high-k dielectric layer 221 corresponding to the transition region III. The removed portion of the protection layer 240, the first work function layer 230, and the high-k dielectric layer 221 may correspond to the transition region III. That is, the patterned layer 250 may be used to define the dimension of the transition region III. In one embodiment, the patterned layer 250 may be made of a photoresist material.

Moreover, the dimension of the transition region III defined by the patterned layer 250 may not be too large or too small. That is, along a direction perpendicular to the length direction of the fin structures 210, the width of the transition region III may not be too large or too small. When the width of the transition region III is overly large, the integration level of the semiconductor structure may be reduced. When the width of the transition region III is too small, the first region I and the second region II may not be effectively isolated from each other. As such, in a subsequent process, the removal of the portion of the first work function layer 230 formed in the first region I may have undesired effect on the portion of the first work function layer 230 formed in the second region II. Therefore, along the direction perpendicular to the length direction of the fin structures 210, the width of the transition region III may be in a range of approximately 36 nm to 86 nm.

Referring back to FIG. 14, the portion of the protection layer exposed by the patterned layer together with the portion of the first work function layer and the high-k dielectric layer formed under the portion of the protection layer may be removed through an etching process using the patterned layer as an etch mask (S405). The schematic cross-section view of the semiconductor structure in FIG. 9 illustrates the removal of the portion of the protection layer, the first work function layer, and the high-k dielectric layer.

Referring to FIG. 9, after forming the patterned layer 250, by further using the patterned layer 250 as an etch mask, the portion of the protection layer 240 exposed by the patterned layer 250 together with a portion of the first work function layer 230 and the high-k dielectric layer 221 formed under the exposed portion of the protection layer 240 may be removed. That is, the portion of each of the protection layer 240, the first work function layer 230, and the high-k dielectric layer 221 formed in the transition region III may be removed.

Figure 10:
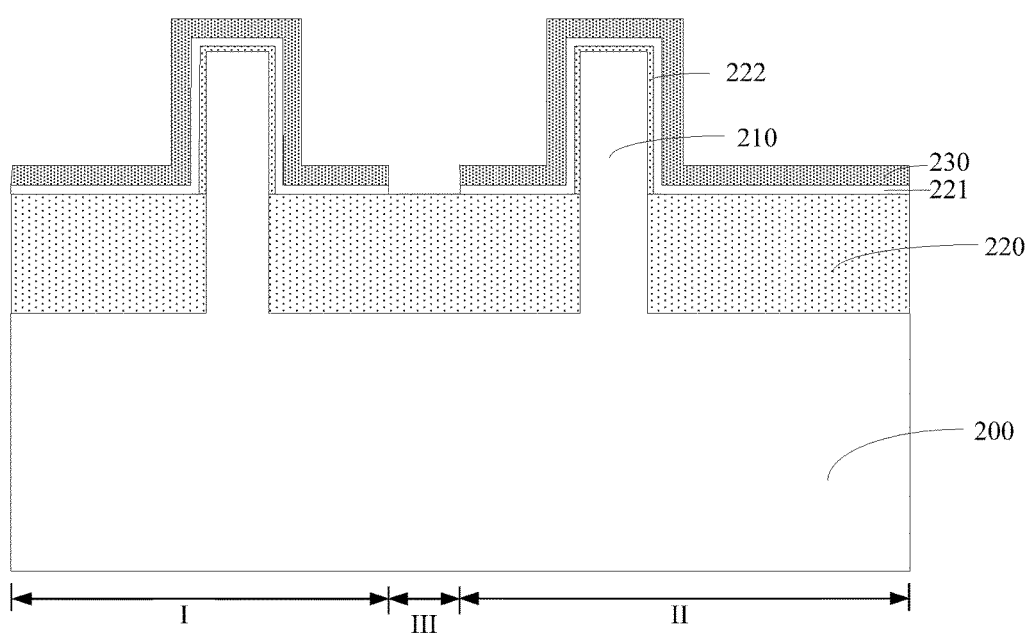

Referring back to FIG. 14, the patterned layer and the protection layer may both be removed (S406). FIG. 10 illustrates a schematic cross-section view of a semiconductor structure consistent with some embodiments of the present disclosure.

Referring to FIG. 10, the patterned layer 250 and the protection layer 240 may be removed. In one embodiment, the protection layer 240 may be used to isolate the first work function layer 230 and the patterned layer 250. Moreover, the patterned layer 250 is usually removed by an ashing process. However, during the ashing process, the O, N, H, and other atoms in the patterned layer 250 may react with the first work function layer 230 by chemical reactions. Therefore, the presence of the protection layer 240 may be able to prevent the first work function layer 230 from contacting the patterned layer 250. As such, undesired chemical reaction between the first work function layer 230 and the patterned layer 250 may be avoided, and thus the quality of the first work function layer 230 may be improved.

In one embodiment, the process to remove the portion of the protection layer 240, the first work function layer 230, and the high-k dielectric layer 221 formed in the transition region III may be a dry etching process. For example, the process parameters adopted in the dry etching process may include an etch gas including $CF_4$, $SF_6$, $Cl_2$, and $O_2$, a flowrate of $CF_4$ in a range of approximately 10 sccm to 500 sccm, a flowrate of $SF_6$ in a range of approximately 20 sccm to 300 sccm, a flowrate of $Cl_2$ in a range of approximately 6 sccm to 120 sccm, a flowrate of $O_2$ in a rage of approximately 1 sccm to 90 sccm, a process pressure in a range of approximately 1 mTorr to 250 mTorr, and a process power in a range of approximately 100 W to 500 W.

In one embodiment, the process to remove the protection layer 240 may be different from the process to remove the patterned layer 250. That is, the patterned layer 250 may be removed before removing the protection layer 240. Moreover, the patterned layer 250 may be removed by an ashing process, and the protection layer 240 may be removed by a wet etching process or a dry etching process.

Figure 11:
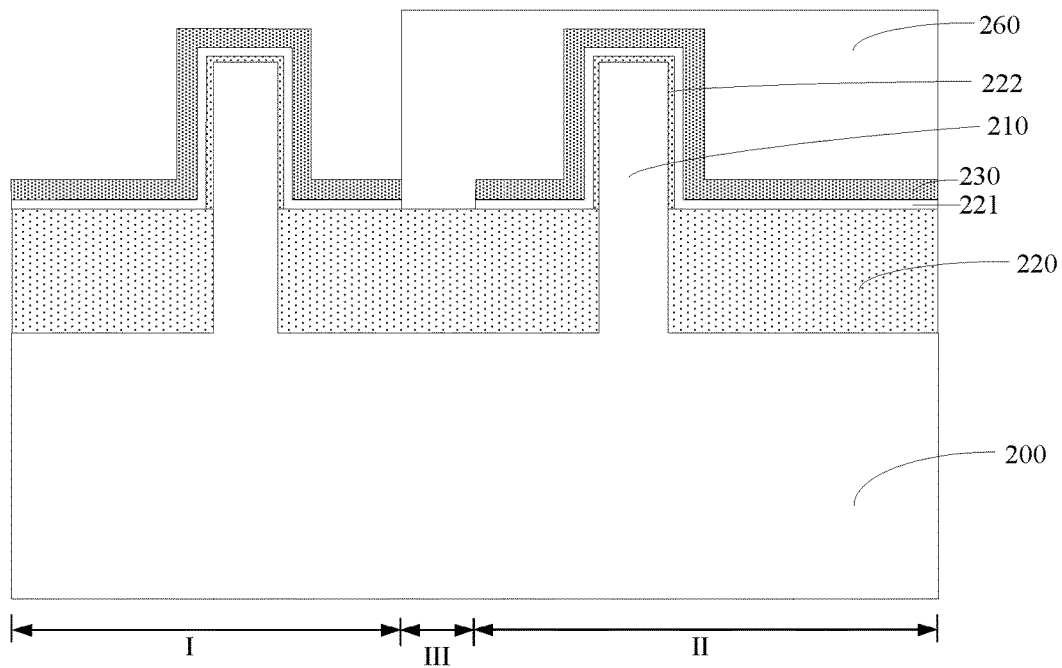

Referring back to FIG. 14, a hard mask layer may be formed on the isolation structure in the transition region and also on the first work function layer in the second region (S407). FIG. 11 illustrates a schematic cross-section view of a semiconductor structure consistent with some embodiments of the present disclosure.

Referring to FIG. 11, a hard mask layer 260 may be formed on the isolation structure 220 in the transition region III and also on the first work function layer 230 in the second region II.

In one embodiment, the hard mask layer 260 may be used to protect the isolation structure in the transition region III and the first work function layer 230 in the second region II. The hard mask layer 260 may be made of one or more of SiN, SiCN, SiBN, SiOCN, and SiON.

Referring back to FIG. 14, the portion of the first work function layer formed in the first region may be removed through an etching process using the hard mask layer as an etch mask (S408). FIG. 12 illustrates a schematic cross-section view of a semiconductor structure consistent with some embodiments of the present disclosure.

Referring to FIG. 12, the portion of the first work function layer 230 formed in the first region I may be removed by etching using the hard mask layer 260 as an etch mask.

According to the disclosed fabrication method, the portion of the protection layer 240 (referring to FIG. 9), the first work function layer 230, and the high-k dielectric layer 221 formed in the transition region III is removed by etching using the patterned layer 250 (referring to FIG. 9) as the etch mask such that the first region I and the second region II are separated or otherwise disconnected from each other. In addition, by using the hard mask layer 260 to protect the second region II and the transition region III, the process to remove the portion of the first work function layer 230 formed in the first region I may not easily affect the transition region III and the portion of the first work function layer 230 in the second region II. As such, the quality of the first work function layer 230 and the quality of a subsequently-formed second work function layer may both be improved. Accordingly, the second work function layer may be able to effectively adjust the threshold voltages of the first devices and the first work function layer 230 may be able to effectively adjust the threshold voltages of the second devices. Therefore, the electrical performance of the semiconductor structure may be improved.

Moreover, according to the disclosed fabrication method, the process to remove the portion of the first work function layer 230 in the first region I using the hard mask layer 260 is a wet etching process. Specifically, because the first region I and the second region II are separated from each other by the transition region III, the etch solution used in the wet etching process may not likely etch the portion of the first work function layer 230 formed in the second region II. Therefore, the quality of the first work function layer 230 may be improved. In a subsequent process, a second work function layer may be formed on the portion of the high-k dielectric layer 221 in the first region I, the portion of the isolation structure 220 in the third region III, and the portion of the first work function layer 230 in the second region II. Because the quality of the first work function layer 230 may be improved, the quality of the second work function layer may also be improved.

Referring back to FIG. 14, the hard mask layer may be removed, and then a second work function layer may be formed on the portion of the high-k dielectric layer in the first region, the portion of the isolation structure in the third region, and the portion of the first work function layer in the second region (S409). FIG. 13 illustrates a schematic cross-section view of a semiconductor structure consistent with some embodiments of the present disclosure.

Referring to FIG. 13, the hard mask layer 260 may be removed. Then, a second work function layer 270 may be formed on the portion of the high-k dielectric layer 221 in the first region I, the portion of the isolation structure 220 in the third region III, and the portion of the first work function layer 230 in the second region II.

In one embodiment, the second work function layer 270 may be used to adjust the threshold voltages for the plurality of first devices to be formed in the first region I. The second work function layer 270 may be made of one or more of TiAl, Al, TiC, and TiCAl. Moreover, the second work function layer 270 may be formed by an ALD process or a CVD process.

In one embodiment, the thickness of the second work function layer 270 may be determined based on the requirements of the first devices. The thickness of the second work function layer 270 may not be too large or too small. When the thickness of the second work function layer 270 is too large or too small, the second work function layer 270 may not electrically match with the first devices. Therefore, in one embodiment, the thickness of the second work function layer 270 may be in a range of approximately 30 Å to 60 Å.

According to the disclosed fabrication method, the transition region III is formed to separate the first region I and the second region II. Therefore, the quality of the first work function layer 230 and the quality of the second work function layer 270 may be desired. Accordingly, the first work function layer 230 may be able to effectively adjust the threshold voltages of the second devices and the second work function layer 270 may be able to effectively adjust the threshold voltages of the first devices. As such, the electrical performance of the semiconductor structure may be improved.

Further, the present disclosure also provides a semiconductor structure. FIG. 13 illustrates a schematic cross-section view of an exemplary semiconductor structure consistent with some embodiments of the present disclosure.

Referring to FIG. 13, the semiconductor structure may include a base substrate. The base substrate may further include a substrate 200 and a plurality of discrete fin structures 210 formed on the substrate 200. The substrate 200 may include a first device region I used to form a plurality of first devices, a second device region II used to form a plurality of second devices, and a transition region III separating the first device region I and the second device region II.

The semiconductor structure may include an isolation structure 220 formed on the portion of the substrate 200 exposed by the plurality of fin structures 210, an interfacial dielectric layer 222 formed on the plurality of fin structures 210, a high-k dielectric layer 221 formed on the portion of the isolation structure 220 exposed by the fin structures 210 in the first device region I and the second device region II and also on the interfacial dielectric layer 222, a first work function layer 230 formed on the portion of the high-k dielectric layer 221 in the second region II, and a second work function layer 270 formed on the portion of the high-k dielectric layer 221 in the first region I, the portion of the isolation structure in the transition region III, and the first work function layer 230 in the second region II.

In one embodiment, the type of the plurality of first devices formed in the first region I may be different from the type of the plurality of second devices formed in the second region II.

According to the disclosed semiconductor structure, the transition region III separates the first region I and the second region II. Therefore, the quality of the first work function layer 230 and the quality of the second work function layer 270 may be desired. Accordingly, the first work function layer 230 may be able to effectively adjust the threshold voltages of the second devices and the second work function layer 270 may be able to effectively adjust the threshold voltages of the first devices. As such, the electrical performance of the semiconductor structure may be improved.

Compared to conventional semiconductor structures and fabrication methods, the disclosed semiconductor structures and fabrication methods may demonstrate several advantages.

According to the disclosed semiconductor structures and fabrication methods, a portion of the first work function layer may be removed through an etching process such that a transition region may be defined to separate the first region and the second region. That is, a transition region may be defined to separate the plurality of first devices from the plurality of second devices. Further, a hard mask layer may be formed to cover the base substrate in the transition region and the portion of the first work function layer in the second region. In a subsequent process, the portion of the first work function layer formed in the first region may be removed. Because the first region and the second region are separated from each other, and the hard mask layer provides protection for the first work function formed in the second region and the base substrate in the transition region, the process to remove the portion of the first work function layer formed in the first region may not cause undesired effect on the transition region and the second region. Specifically, in the field of semiconductor manufacturing, a wet etching process is usually used to remove the portion of the first work function layer formed in the first region. Because the first region is separated from the second region by the transition region, the etch solution used in the wet etching process may not be likely etch the portion of the first work function layer formed in the second region, and thus the quality of the first work function layer may be improved. Further, a second work function layer is then formed on the base substrate and the first work function layer. Because of the improved quality of the first work function layer, the quality of the subsequently-formed second work function layer may also be improved. As such, the first work function layer may be able to effectively adjust the threshold voltages of the second devices formed in the second region and the second work function layer may be able to effectively adjust the threshold voltages of the first devices formed in the first region. Therefore, the electrical performance of the semiconductor structure may be improved.

Optionally, during the etching process to remove the portion of the first work function layer corresponding to the transition region, the protection layer may be used to protect the portion of the first work function layer in the first region and the second region. Specifically, because the protection layer is formed between the first work function layer and the patterned layer, the protection layer is able to separate the first work function layer and the patterned layer. In a subsequent process, an ashing process is usually used to remove the patterned layer. Because during the ashing process, the O, N, H, and other atoms in the patterned layer may react with the first work function layer by chemical reactions. Therefore, the presence of the protection layer may be able to prevent the first work function layer from contacting the patterned layer. As such, undesired chemical reaction between the first work function layer and the patterned layer may be avoided, and thus the quality of the first work function layer may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
    providing a base substrate including a first device region, a second device region, and a transition region separating the first region from the second region;
    forming a first work function layer on the first region, the transition region, and the second region of the base substrate;
    removing a first portion of the first work function layer formed in the transition region;
    forming a hard mask layer on the base substrate in the transition region and on the first work function layer in the second region;
    removing a second portion the first work function layer formed in the first region using the hard mask layer as an etch mask;
    removing the hard mask layer; and
    forming a second work function layer, on the base substrate in the first region and the transition region, and on the first work function layer in the second region.

2. The method according to claim 1, wherein removing the first portion of the first work function layer formed in the transition region includes:
    forming a protection layer on the first work function layer;
    forming a patterned layer on the protection layer to expose the first portion of the first work function layer formed in the transition region;
    removing the protection layer formed in the transition region and the first portion of the first work function layer formed in the transition region using the patterned layer as an etch mask; and
    removing the patterned layer and the protection layer.

3. The method according to claim 2, wherein:
    the protection layer is made of at least one of polycrystalline silicon and amorphous silicon.

4. The method according to claim 2, wherein:
    removing the protection layer formed in the transition region and the first portion of the first work function layer formed in the transition region includes a dry etching process.

5. The method according to claim 4, wherein process parameters used in the dry etching process include:
    an etch gas including $CF_4$, $SF_6$, $Cl_2$, and $O_2$;
    a flowrate of $CF_4$ in a range of approximately 10 sccm to 500 sccm;
    a flowrate of $SF_6$ in a range of approximately 20 sccm to 300 sccm;
    a flowrate of $Cl_2$ in a range of approximately 6 sccm to 120 sccm;
    a flowrate of $O_2$ in a rage of approximately 1 sccm to 90 sccm;
    a process pressure in a range of approximately 1 mTorr to 250 mTorr; and
    a process power in a range of approximately 100 W to 500 W.

6. The method according to claim 2, wherein:
    an ashing process is performed to remove the patterned layer.

7. The method according to claim 1, wherein:
    a width of the transition region is in a range of approximately 36 nm to 86 nm.

8. The method according to claim 1, wherein:
    a plurality of first devices are formed in the first region; and
    a plurality of second devices are formed in the second region.

9. The method according to claim 8, wherein:
    a type of the plurality of first devices formed in the first region is different from a type of the plurality of second devices formed in the second region.

10. The method according to claim 9, wherein:
    the plurality of first devices are N-type metal-oxide-semiconductor (NMOS) devices; and
    the plurality of second devices are P-type metal-oxide-semiconductor (PMOS) devices.

11. The method according to claim 10, wherein:
    the first work function layer is made of at least one of TiN, TaN, and TiSiN.

12. The method according to claim 11, wherein:
a thickness of the first work function layer is in a range of approximately 25 Å and 50 Å.

13. The method according to claim 10, wherein:
the second work function layer is made of at least one of TiAl, Al, TiC, and TiCAl.

14. The method according to claim 13, wherein:
a thickness of the second work function layer is in a range of approximately 30 Å and 60 Å.

15. The method according to claim 1, prior to forming the first work function layer, further including:
forming a high-k dielectric layer on the base substrate.

16. The method according to claim 1, wherein:
the base substrate includes a substrate and a plurality of discrete fin structures formed on the substrate.

* * * * *